United States Patent [19]
Takasu

[11] Patent Number: 5,365,094
[45] Date of Patent: Nov. 15, 1994

[54] SEMICONDUCTOR DEVICE INCLUDING FERROELECTRIC NONVOLATILE MEMORY

[75] Inventor: Hidemi Takasu, Ukyo, Japan

[73] Assignee: Rohm Company Limited, Kyoto, Japan

[21] Appl. No.: 948,682

[22] Filed: Nov. 12, 1992

[30] Foreign Application Priority Data

Nov. 18, 1991 [JP] Japan .................................. 3-301680

[51] Int. Cl.$^5$ ............................................ H01L 29/78
[52] U.S. Cl. .................................... 257/295; 257/316; 257/410
[58] Field of Search ................. 257/295, 410; 365/145

[56] References Cited

U.S. PATENT DOCUMENTS 4,888,630 12/1989 Paterson ............................... 257/324
5,099,305 3/1992 Takenaka ............................. 257/295
5,218,512 6/1993 Nakamura ............................ 257/528

OTHER PUBLICATIONS

Arnett, P. "Ferroelectric FET Devices", IBM Tech. Disclosure Bulletin, vol. 15, No. 9, Feb. 1973, p. 2825.

Primary Examiner—Robert P. Limanek
Attorney, Agent, or Firm—Peter Jon Gluck

[57] ABSTRACT

The present invention provides a ferroelectric nonvolatile memory that utilizes ferroelectric properties and is able to operate correctly at lower voltage. A memory storage cell of the memory has the structure wherein a N+ type drain (24) and a N+ type source (26) is provided for a P type well (14) created in the substrate. A film (22) of high dielectric material spans the space (28) between the drain (24) and the source (26). A conductive metalization (20) overlies the film (22), a film (18) of ferroelectric material overlies the conductive metalization (20) and a metalization 16 overlies the film (18).

7 Claims, 5 Drawing Sheets

F I G. 1
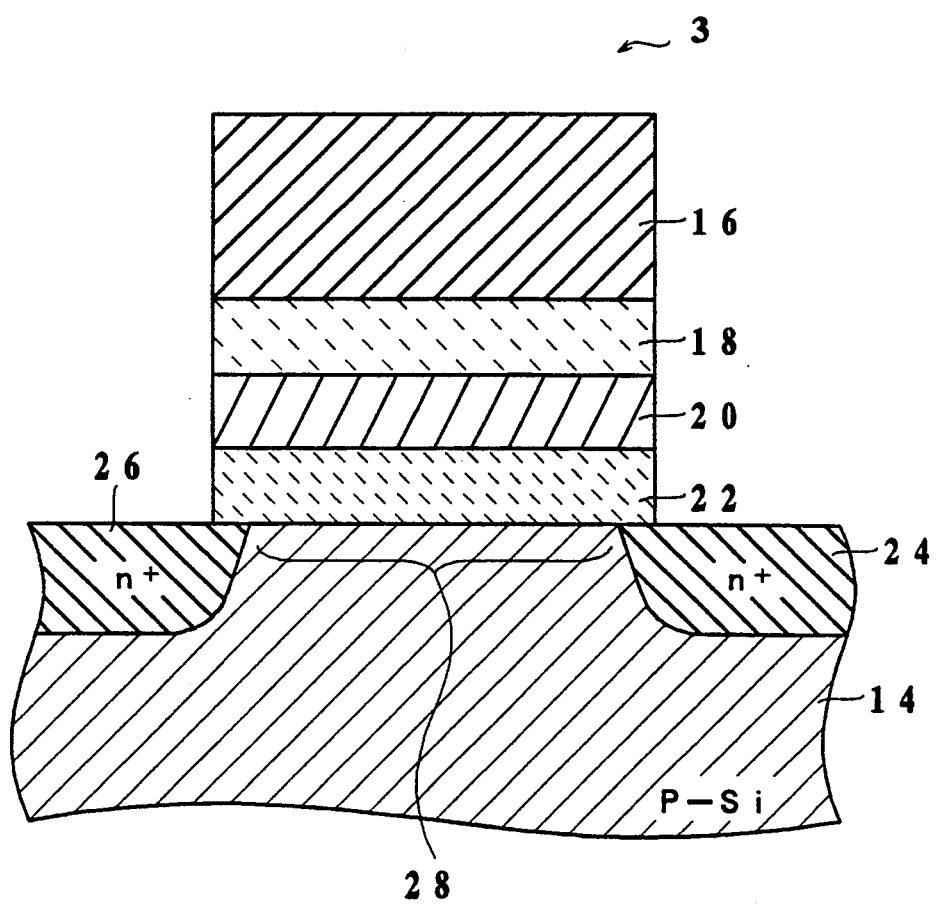

SEMICONDUCTOR DEVICE INCLUDING FERROELECTRIC NONVOLATILE MEMORY

BACKGROUND OF THE INVENTION

1. Field of the Invention

The present invention relates to a semiconductor device including a ferroelectric nonvolatile memory which utilize ferroelectric properties.

2. Description of the Prior Art

Some semiconductor devices which are conventionally known comprise semiconductor nonvolatile memories. A floating-gate type memory cell and MNOS a (Metal-Nitride-Oxide-Semiconductor) type memory cell are well known as one type of nonvolatile memory. But U.S. Pat. No. 3,832,700 discloses a nonvolatile memory which utilizes ferroelectric properties: remanence and reversibly dielectric polarization. Such a ferroelectric nonvolatile memory is characterized in that the speed of its operation for writing and erasing is high.

FIG. 4 shows the memory cell 1 of this ferroelectric nonvolatile memory in schematic sectional view.

Referring to FIG. 4, a N+ type drain 6 and a N+ type source 8 are created in P type silicon substrate 10. A film 4 of ferroelectric material spans the space 12 between the drain 6 and the source 8. On top of the ferroelectric film 4 is a conductive metalization 2 such as aluminum which acts as a control electrode. Note that the space 12 is referred to as channel region hereinafter.

A logic "1" can be written into and erased from the above-mentioned memory cell 1 by electricity. Accordingly, the memory cell 1 has two stable states: one in which a logic "1" has been written therein, and the other in which the logic "1" has been erased or a logic "0" has been stored therein. The fact that the memory cell 1 can take these two stable states is utilized to fabricate a memory.

FIG. 5 shows hysteresis loop which the memory cell 1 exhibits. Referring to FIG. 5, the vertical axis represents polarization P and horizontal axis represents electric field E. There will be described the way in which the logic "1" is able to be written into and erased from the memory cell 1 with reference to FIG. 5.

In order to write a logic "1" into a memory cell 1, ground potential is applied to the substrate 10 and more programming voltage than positive coercive voltage is applied to the control electrode 2. Note that the coercive voltage is a voltage applied to the control electrode 2 with which the memory cell 1 can remove the existing negative polarization of the film 4. At that time, an electric field develops between the substrate 10 and the control electrode 2 and thereby the ferroelectric film 4 is polarized into a direction parallel to the electric field, as symbolized by point P1 in FIG. 5. In addition, this polarization will remain as it is even if the gate voltage is cut off, as symbolized by point Q1 in FIG. 5.

This status in polarization of the ferroelectric film 4 mean that a logic "1" has been written into the memory cell 1. In the memory cell 1 having the logic "1", the channel region 12 is conductive because a portion of the ferroelectric film near the control electrode 2 is in charge of the negative and a portion of the ferroelectric film 4 near the substrate 10 is in charge of the positive.

On the other hand, in order to erase the logic "1" from the memory cell 1 or to write a logic "0" therein, ground potential is applied to the substrate 10 and less programming voltage than negative coercive voltage is applied to the control electrode 2. At that time, an electric field of the opposite polarity to that used when writing the logic "1" between the substrate 10 and the control electrode 2 and thereby the ferroelectric film 4 is polarized into the direction parallel to the electric field, as symbolized by point R1 in FIG. 5. In addition, this polarization will remain as it is even if the gate voltage is cut off, as symbolized by point S1 in FIG. 5.

This status in polarization of the ferroelectric film 4 means that the logic "1" has been erased or a logic "0" has been written into the memory cell 1. In the memory cell 1 with the logic "0", the channel region 12 is nonconductive because a portion of the ferroelectric film 4 near the control electrode 2 is in charge of the positive and a portion of the ferroelectric film near the substrate is in charge of the negative.

The operation of reading information from a memory cell 1 will be described below. It is determined whether the memory cell 1 has a logic "0" or a logic "1", by determining whether or not a current flows through the channel region 12 when a stable voltage is applied to the source 8 relative to the drain 6 of the memory cell 1.

A ferroelectric nonvolatile memory (not shown) can be constructed using the memory cells 1 described above.

However, semiconductor devices including such memory devices have the following problems.

The problem lies in the border between the channel region 12 and the ferroelectric film 4 because the ferroelectric film 4 is deposited directly on the substrate 10. Specifically, the surface of the channel region 12 is oxidized when the ferroelectric film 4 is deposited on the substrate 10. This oxidized surface hinders operation at lower voltage because it lower the relative power of field effect applied to the ferroelectric film when a certain programming voltage is applied to the control electrode relative to the substrate 10.

Also, components such as a metallic component of the ferroelectric film is diffused to the channel region 12 of silicon during the manufacturing process of memory circuit. In other word, the desired clean surface of the channel region 12 was not obtained. In this case, the memory constructed by using the memory cell 1 was not able to operate correctly.

SUMMARY OF THE INVENTION

Accordingly, it is an object of the present invention to provide a semiconductor device including a ferroelectric nonvolatile memory that is able to operate correctly at lower voltage.

A semiconductor device including ferroelectric nonvolatile memories according to an embodiment of the invention comprises:
- a first conductivity type semiconductor region;
- a pair of second conductivity type diffusion regions formed in the first conductivity type semiconductor region and defining a space between the pair of diffusion regions;
- an insulating layer spanning the space between the pair of diffusion regions;
- a ferroelectric layer overlying the insulating layer; and
- a control electrode overlying the ferroelectric layer.

A semiconductor device including ferroelectric nonvolatile memories according to another embodiment of the invention comprises:

a first conductivity type semiconductor region;

a pair of second conductivity type diffusion regions formed in the first conductivity type semiconductor region and defining a space between the pair of diffusion regions;

an insulating layer spanning the space between the pair of diffusion regions;

a conducting layer with orientation overlying the insulating layer;

a ferroelectric layer overlying the conducting layer; and a control electrode overlying the ferroelectric layer.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1 is a view schematically showing the construction in section of a memory cell 3 according to an embodiment of the present invention.

DETAILED DESCRIPTION OF THE INVENTION

Figure 2:
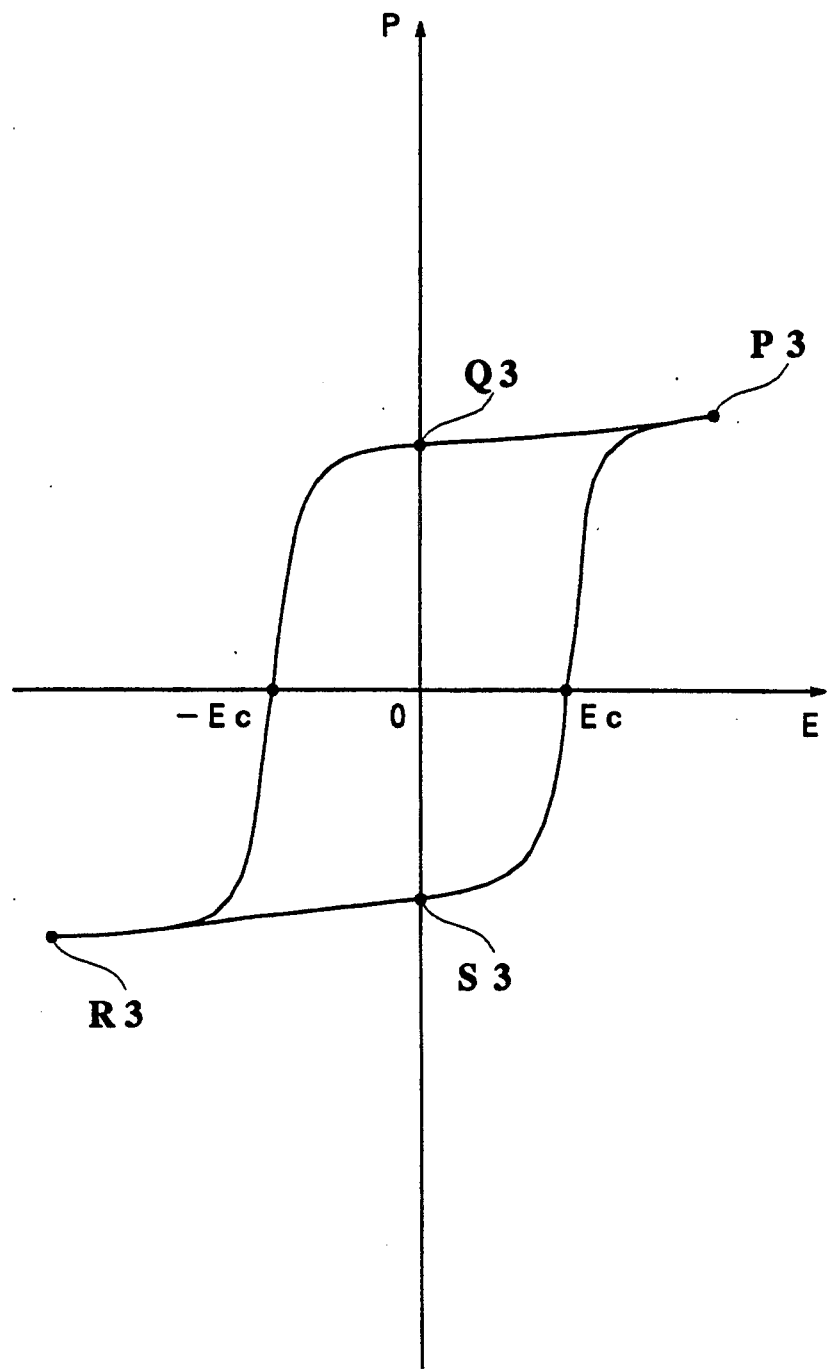
FIG. 2 is a view showing the hysteresis loop for threshold voltage of the memory cell 3.

A semiconductor device including a ferroelectric nonvolatile memory according to an embodiment of the present invention will be described below. A memory cell 3 of the ferroelectric nonvolatile memory is shown in schematic sectional view in FIG. 1.

Referring to FIG. 1, a N+ type drain 24 and a N+ type source 26, which act as a pair of second conductivity type diffusion region, is formed in a P type well 14 of the first conductivity type semiconductor region created in the substrate. A film 22 of high dielectric material such as $SrTiO_3$, which acts as an insulating layer, spans the space 12 between the drain 24 and the source 26. Note that the space 28 is referred to as channel region hereinafter. On top of the high dielectric film 22 is a conductive metalization 20 such as platinum which acts as a conducting layer with orientation. On top of the conductive metalization 20, is a film 18 of ferroelectric material such as $PbTiO_3$. On top of the film 18, is a metalization 16 such as platinum which acts as a control electrode.

A logic "1" can be written into and erased from the above-mentioned memory cells 3 by electricity. Accordingly, the memory cells 3 has two stable states: one in which a logic "1" has been written therein, and the other in which the logic "1" has been erased or a logic "0" has been stored therein. The fact that the memory cells 3 can take these two stable states is utilized to fabricate a memory.

Figure 4:
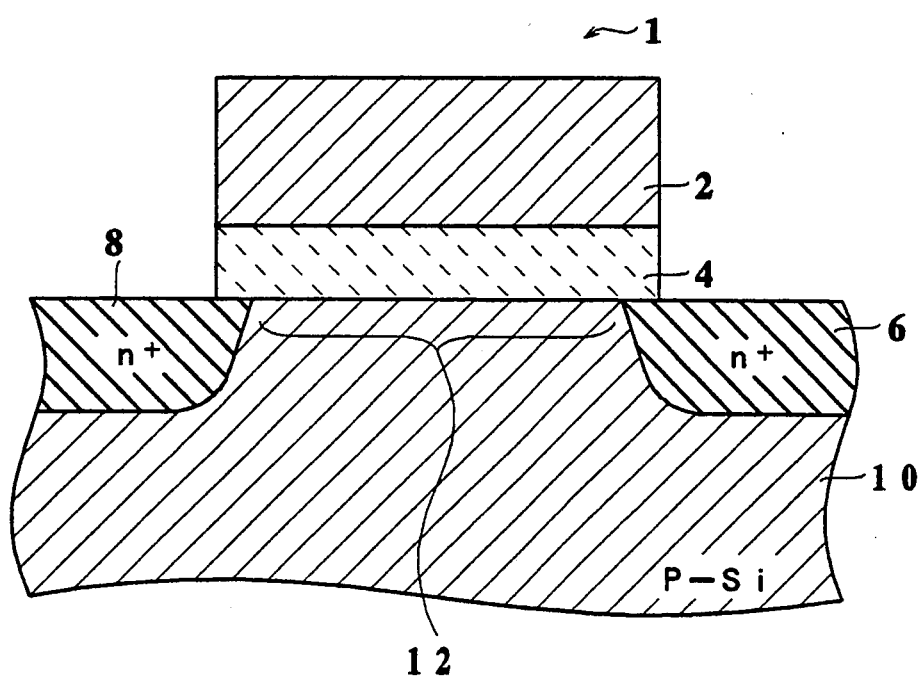
FIG. 4 is a view schematically showing the construction in section of a memory cell 1 according to prior art.
Figure 5:
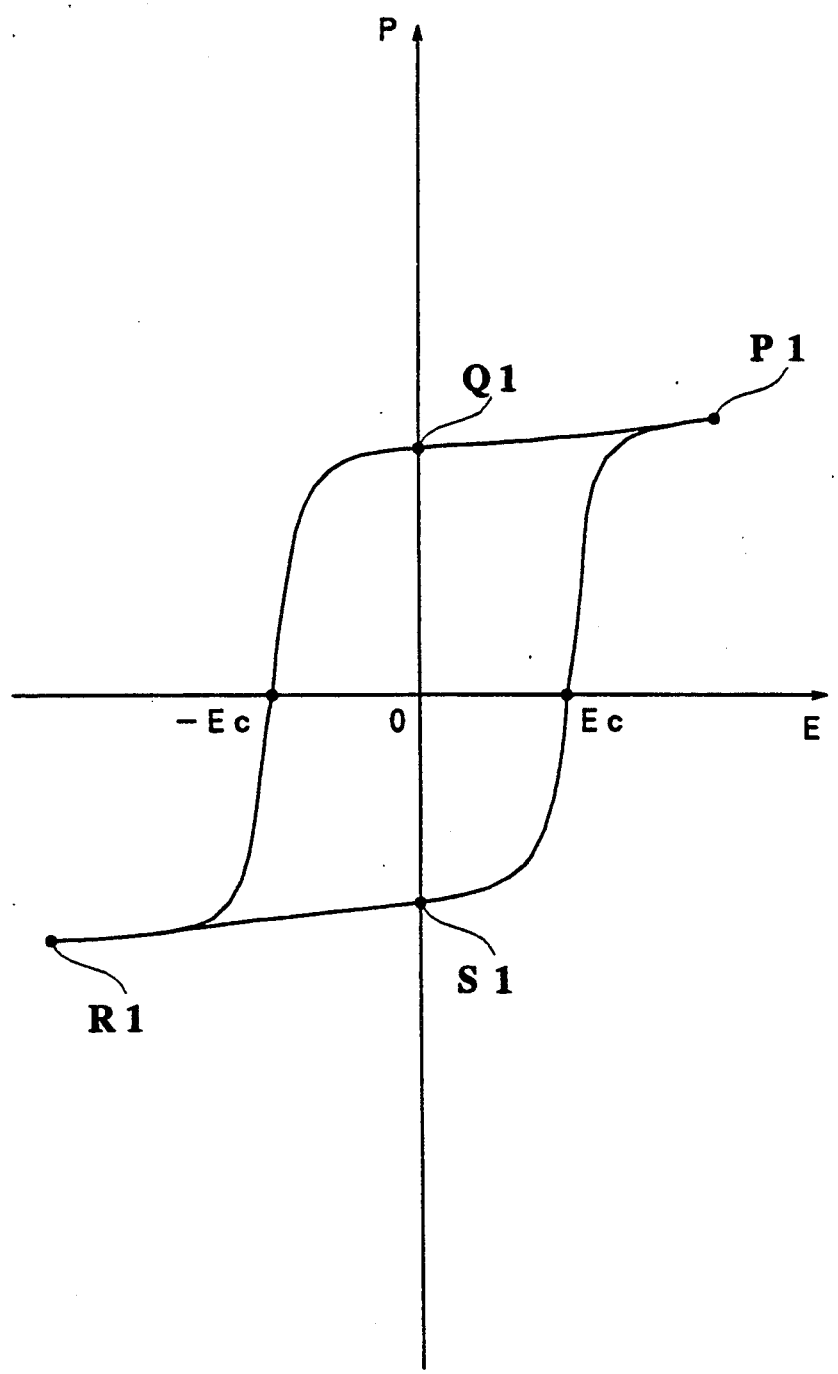
FIG. 5 is a view showing the hysteresis loop for threshold voltage of the memory cell 1.

FIG. 2 shows hysteresis loop which the memory cells 3 exhibits. Referring to FIG. 4, the vertical axis represents polarization P and horizontal axis represents electric field E. There will be described the way in which the logic "1" is able to be written into and erased from the memory cell 3 with reference to FIG. 2.

In order to write a logic "1" into a memory cell 3, grand potential is applied to the well 14 and more programming voltage than positive coercive voltage is applied to the control electrode 16. Note that the coercive voltage is a voltage applied to the control electrode 16 with which the memory cell 3 can remove the existing negative polarization of the film 4. At that time, an electric field develops between the well 14 and the control electrode 16 and thereby the ferroelectric film 18 is polarized into a direction parallel to the electric field, as symbolized by point P3 in FIG. 2. In addition, this polarization will remain as it is even if the gate voltage is cut off, as symbolized by point Q3 in FIG. 2.

This status in polarization of the ferroelectric film 18 mean that a logic "1" has been written into the memory cell 3. In the memory cell 3 having the logic "1", the channel region 28 is conductive because a portion of the ferroelectric film 18 near the control electrode 16 is in charge of the negative and a portion of the ferroelectric film 18 near the well 14 is in charge of the positive.

On the other hand, in order to erase the logic "1" from the memory cell 3 or to write a logic "0" therein, ground potential is applied to the well 14 and less programming voltage than negative coercive voltage is applied to the control electrode 16. At that time, an electric field of the opposite polarity to that used when writing the logic "1" between the well 14 and the control electrode 16 and thereby the ferroelectric film 18 is polarized into the direction parallel to the electric field, as symbolized by point R3 in FIG. 2. In addition, this polarization will remain as it is even if the gate voltage is cut off, as symbolized by point S3 in FIG. 2.

This status in polarization of the ferroelectric film 18 mean that the logic "1" has been erased or a logic "0" has been written into the memory cell 3. In the memory cell 3 with the logic "0", the channel region 28 is nonconductive because a portion of the ferroelectric film 18 near the control electrode 16 is in charge of the positive and a portion of the ferroelectric film 18 near the well 14 is in charge of the negative.

The operation of reading information from the memory cell 3 will be described below. It is determined whether the memory cell 3 has a logic "0" or a logic "1", by determining whether or not a current flows through the channel region 28 when a stable voltage is applied between the source 26 and the drain 24 of the memory cell 3.

A ferroelectric nonvolatile memory (not shown) can be constructed using the memory cells 3 described above.

The manufacturing process for the memory cells 3 in the memory circuit will be described below with reference to FIGS. 3A through 3C.

Figure 3A:
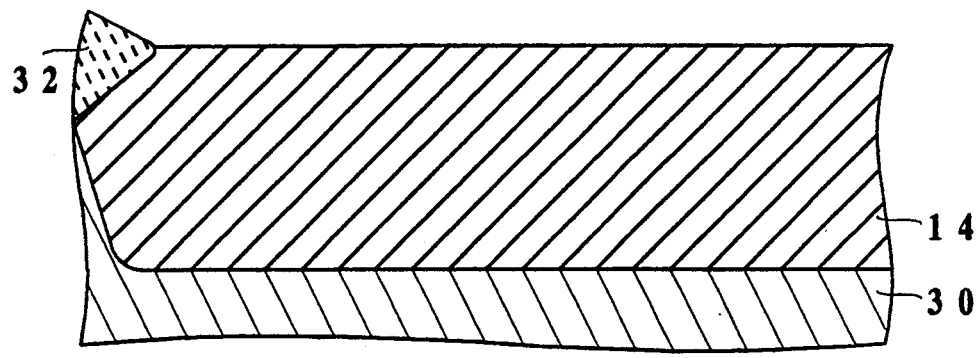
FIGS. 3A through 3C are views showing the manufacturing process of the memory cell 3.
Figure 3B:
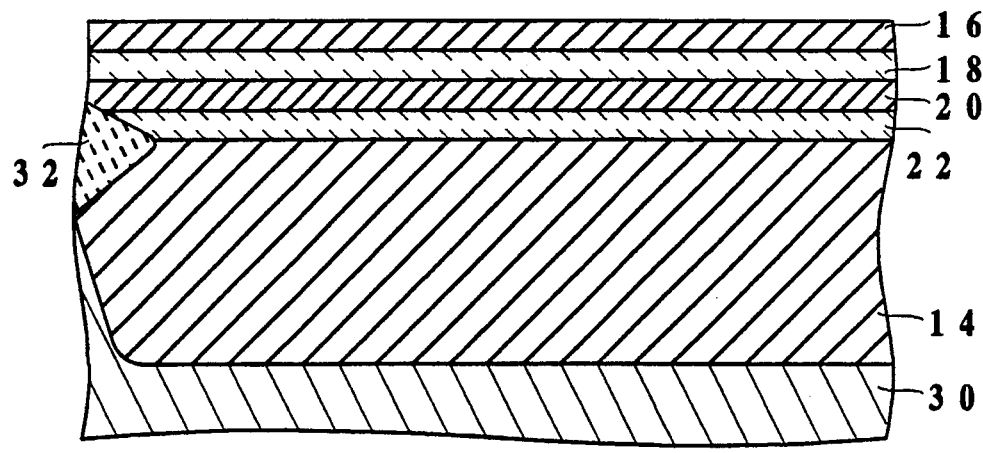

Referring to FIG. 3A, within the N type silicon substrate 30, there is provided a P type silicon well 14 which is marked off with field oxide layers 32. Referring to FIG. 3B, on top of the silicon well 14, a high dielectric film 22 of $SrTiO_3$ and a layer 20 of platinum is deposited by CVD (Chemical Vapor Deposition) technique. On top of the layer 20, a ferroelectric film of $PbTiO_3$ is then deposited by a RF(radio-frequency) deposition sputtering technique and heat treatment for several hours on the following conditions.

Targets are sintered powder of $Pb_3O_4$ and $TiO_3$ with excessive 10 wt % of lead for compensation of deficient lead in the deposited and the powder is pressed together onto quartz plate with a diameter of 80 mm. Rf sputtering is performed in the mixture of argon[90%]- oxygen[10%] with a pressure of $2\times10-1$ torr. at target PR voltage of 1.6 kV and sputtering power of 150 W. Temperature of the substrate is 400° to 500° C. and sputtering rate is 3 nm per minute. More specifically, temperature of substrate keeps 400 ° C. during shutting and 500° during heat treatment. On top of the ferroelectric film 18, a layer 16 of platinum is deposited by CVD technique.

Figure 3C:
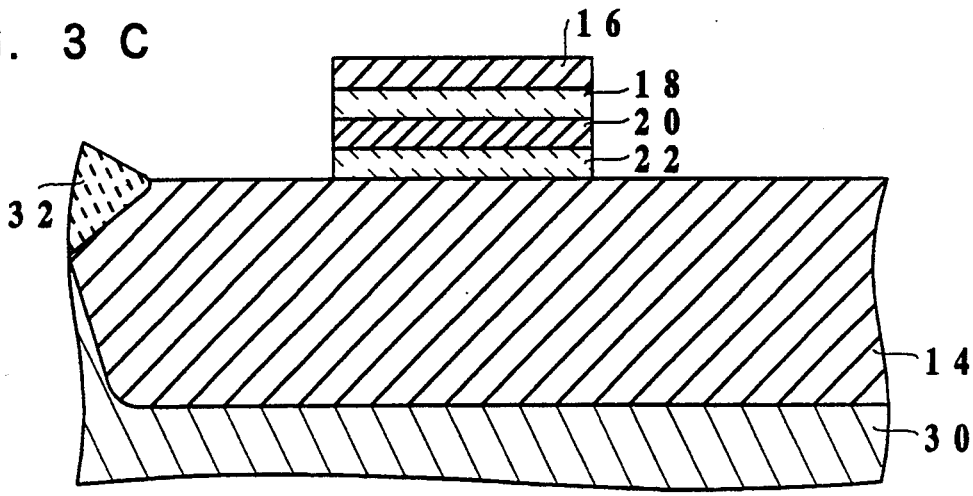

The resulting structure is then subjected to etching using resist as a mask, to form the platinum layer 16 and the ferroelectric film 18 as shown in FIG. 3C. Then, arsenic or phosphorus is ion-implanted and thermally diffused to form a N+drain 24 and a N+source 26 (see FIG. 1).

At that time, the border between the well 14 and the high dielectric film 22 is clean as well as the border between the layer 20 and the ferroelectric film 18.

Although in the preferred embodiment the ferroelectric film 18 is made of $PbTiO_3$ material, in alternative embodiments it may comprise any one of the known reversibly polarizable ferroelectric materials, such as $BaTiO_3$, $BiTiO_3$ and PLZT.

Although in the preferred embodiment the conducting layer is made of platinum, in alternative embodiments it may comprise any one of the materials of good orientation and it may comprise a layer of platinum and another conducting body underling the layer of platinum.

Although in the preferred embodiment the high dielectric film is made of $SrTiO_3$ material, in alternative embodiments it may comprise any one of the known high dielectric materials.

Although in the preferred embodiment the first conductivity type has been assumed to be P type and the second conductivity type to be N type, in alternative embodiments the first conductivity may also be N type and the second conductivity type may be P type.

In the preferred embodiment of a semiconductor device including ferroelectric nonvolatile memories according to the present invention, the film 22 of insulator prevent metallic component of the ferroelectric film 18 from diffusing to the well 14, and the border between the film 22 and the surface of the channel region is so clean that it may not cause the force of the voltage applied to the film 18 at writing and erasing operation to decrease.

Accordingly, the ferroelectric nonvolatile memory is able to operate correctly.

In the preferred embodiment of a semiconductor device including ferroelectric nonvolatile memories according to the present invention, the conductive metalization 20 of platinum with orientation applied on the film 22 of insulator permits the ferroelectric film 18 to grow with better orientation.

Accordingly, the ferroelectric nonvolatile memory is able to operate correctly.

In the preferred embodiment of a semiconductor device including ferroelectric nonvolatile memories according to the present invention, the film 22 of insulator is comprised of high dielectric material.

Therefore, the writing and erasing operations can be carried out at lower programming voltage because the film 22 of high dielectric material heighten the relative power of field effect applied to the ferroelectric film compared with the film 22 of low dielectric material when a certain programming voltage is applied to the control electrode 16 relative to the substrate 10.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A semiconductor device including ferroelectric nonvolatile memory utilizing dielectric polarization comprising:

a first conductivity type semiconductor region;

a pair of second conductivity type diffusion regions formed in the first conductivity type semiconductor region and defining a space between the pair of diffusion regions;

an insulating layer of a material having a dielectric constant magnitudes higher than that of silicon nitride spanning the space between the pair of diffusion regions;

a ferroelectric layer overlying the insulating layer; and a control electrode overlying the ferroelectric layer.

2. A semiconductor device including ferroelectric nonvolatile memory according to claim 1, wherein the pair of second conductive type diffusion regions consists of a source layer and a drain layer, so that a conductive channel may be created between the source layer and the drain layer in some circumstances by applying a voltage to the control electrode.

3. A semiconductor device including nonvolatile memory according to claim 2, wherein the insulating layer is made from a high dielectric material selected from the group consisting of $SrTiO_3$ and $PbZrO_3$.

4. A semiconductor device including ferroelectric nonvolatile memory utilizing dielectric polarization comprising:

a first conductivity type semiconductor region;

a pair of second conductivity type diffusion regions formed in the first conductivity type semiconductor region and defining a space between the pair of diffusion regions;

an insulating layer of $SrTiO_3$ spanning the space between the pair of diffusion regions;

a refractory metal conducting layer having aligned dipole moments, which layer is overlying the insulating layer;

a ferroelectric layer overlying said conducting layer; said conducting layer increasing the alignability of said ferroelectric layer; and, a control electrode overlying the ferroelectric layer.

5. A semiconductor device including ferroelectric nonvolatile memory according to claim 4, wherein the pair of second conductive type diffusion regions consists of a source layer and a drain layer, so that a conductive channel may be created between the source layer and the drain layer in some circumstances by applying a voltage to the control electrode.

6. A semiconductor device including nonvolatile memory according to claim 5, wherein the insulating layer is made from a material having a dielectric constant magnitudes higher than that of silicon nitride.

7. A semiconductor device including nonvolatile memory according to claim 5, wherein the conducting layer is made from a refractory metal selected from the group consisting of Platinum, Molybdenum, Titanium, Tungsten, Tantalum and Nickel.

* * * * *